United States Patent
Candy

(10) Patent No.: US 7,157,969 B2
(45) Date of Patent: Jan. 2, 2007

(54) LOW DISTORTION CLASS D AMPLIFIER USING A CONTROLLED DELAY

(75) Inventor: Bruce Halcro Candy, Basket Range (AU)

(73) Assignee: BHC Consulting Pty., Ltd., Basket Range (AU)

( * ) Notice: Subject to any disclaimer, the term of this patent is extended or adjusted under 35 U.S.C. 154(b) by 163 days.

(21) Appl. No.: 11/065,177

(22) Filed: Feb. 24, 2005

(65) Prior Publication Data

US 2005/0200410 A1    Sep. 15, 2005

(30) Foreign Application Priority Data

Feb. 27, 2004  (AU) .............................. 2004900976

(51) Int. Cl.
*H03F 3/217*  (2006.01)
(52) U.S. Cl. ..................... 330/251; 330/10; 330/207 A
(58) Field of Classification Search .................. 330/10, 330/207 A, 251; 375/238; 370/212
See application file for complete search history.

(56) References Cited

U.S. PATENT DOCUMENTS

| | | | | |
|---|---|---|---|---|
| 6,064,259 A | * | 5/2000 | Takita | 330/10 |
| 7,078,963 B1 | * | 7/2006 | Andersen et al. | 330/10 |
| 2005/0151584 A1 | * | 7/2005 | Sawashi | 330/10 |

* cited by examiner

*Primary Examiner*—Robert Pascal
*Assistant Examiner*—Hieu Nguyen
(74) *Attorney, Agent, or Firm*—Osha Liang L.L.P.

(57) ABSTRACT

An electronic class-D amplifier including a one servo-loop amplifier plus pulse width modulator, and a controlled delay stage including a delay modulation input, and a negative feedback path connects an output of the output switching stage to an input of the servo-loop amplifier wherein the forward gain of an output switching stage, the forward gain of the servo-loop amplifier plus pulse width modulator and controlled delay stage, and a carrier reference output signal's mean frequency, and modulation gain of the controlled delay stage, and the gain of the negative feedback path, are selected to lower the distortion of a signal at the amplifier output relative to a signal applied to the amplifier input.

6 Claims, 3 Drawing Sheets

LOW DISTORTION CLASS D AMPLIFIER USING A CONTROLLED DELAY

TECHNICAL FIELD

This invention relates to a class-D switching amplifier and has particular application to class-D analogue power amplifiers, particularly audio frequency amplifiers.

The following descriptions are provided to assist the reader to understand how the current inventor has proceeded to analyse circuits of which he is aware to assist the reader to understand the relevance of the circuit invention. However these references are not intended and do not of themselves provide any admission by the applicant that they are published as may be required for an assessment of novelty or obviousness or are common general knowledge according to the laws of and in any particular country in the world.

BACKGROUND ART

Several models of commercial switching amplifiers are known which include class-D amplifiers. Most utilise a system including a first order servo-loop amplifier whose output is connected to a modulation input of a pulse width modulator. An output of the pulse width modulator is connected to an input of an output switching stage, which normally includes switch driver circuits. A negative feedback path connects an output of the output switching stage to an input of the servo-loop amplifier and an amplifier input is also connected to an input of the servo-loop amplifier. This system may be viewed conceptually as the output of the servo-loop amplifier, being an integral of an error signal, the error signal being proportional to the difference between the scaled output of the output switching stage and amplifier input signals. This integrated error signal is that which is fed to the said modulation input.

The pulse width modulator in some systems includes a triangular-wave oscillator which acts as a carrier reference signal, which is applied to an input of a comparator. In some systems which are less common, the carrier reference is a sawtooth waveform rather than a triangular-wave. An output of the servo-loop amplifier is also applied to an input of the comparator. The comparator and the triangular wave oscillator act as the said pulse width modulator, wherein an output of the comparator acts as the output of the pulse width modulator. The servo-loop amplifier most often has a forward transfer function which is an input current to output voltage integrator. For clarity, this system will herein be called the triangular-wave carrier input system.

Another way of implementing the pulse width modulator, is to employ the servo-loop amplifier to produce the said integrated error output added to the triangular-wave carrier reference signal, this mixed sum being applied to an input of the said comparator. This is achieved by adding at the servo-loop integrator's input:
  the amplifier input signal, and
  the signal at the output of the output switching stage as a negative feedback path, plus
  a carrier reference square-wave signal.

Thus in this system, at the output of the integrator servo-loop amplifier, appears:
  a the integrated error signal as described above, plus
  an integrated square-wave carrier reference which is thus a triangular-wave carrier reference signal.

For clarity, this system will herein be called a square-wave carrier input system.

Whilst in a square-wave carrier input system the pulse-width modulator action is intrinsic to the whole circuit, because for example the carrier reference triangular-wave signal requires the closed loop negative feedback for D.C. stability, the pulse width modulator may be viewed in a sense as consisting as the carrier reference square-wave, plus the servo-loop integrating amplifier, plus the comparator. These components are associated with a pulse width modulator forward gain. Reference is made below to this gain. The gain of a pulse width modulator is defined as the ratio between the (change in) duty cycle at the output of the pulse width modulator divided by the (change in) mean output signal at the output of the servo-loop (integrated error) amplifier. For the square-wave carrier input, this is inversely proportional to the amplitude of the carrier reference square-wave fed to the servo-loop amplifier input.

Herein for both systems the servo-loop amplifier, plus carrier references, plus pulse width modulator including comparator shall be referred to as a "servo-loop amplifier plus pulse width modulator."

The transfer function between the input and output is effectively the same for both these systems. Both these systems employ negative feedback to reduce distortion, that is, improve accuracy. However, these systems are known intrinsically to produce distortion. That is, the systems produce distortion even for perfect electronic components, or in other words, mathematically for idealised components.

In addition, electronic imperfections which are significant, for example in practical power output switching stages, produce further errors.

Details of a system utilising these basic functions is given in Motorola application note AN1042.

A simpler class-D amplifier with no negative feedback or servo-loop amplifier and direct input signal modulation of the pulse width modulator is utilised by a Zetex integrated circuit ZXCD1000. Assuming all components are ideal in such a system concept, this idealised system is known to produce no distortion in contrast to the servo-loop system described above. However, this direct modulation system in practice is known to have several problems compared to the servo-loop approach, namely:

The output noise is typically higher owing to no feedback.

The distortion resulting from practical electronic components is higher at low frequencies where the negative feedback of the servo-loop system is of assistance.

The output signal of the direct modulation system is proportional to the output stage supply rails and is thus modulated by variations in these rails. Owing to negative feedback, this effect is reduced in the servo-loop system, particularly at lower frequencies which has advantage of more negative feedback.

Class-D amplifiers have been developed by Bang and Olufsen which this company calls its "ICEpower" products. The principles of this system are described in numerous Audio Engineering Society publications and U.S. Pat. No. 6,297,692. This discloses an analogue switching amplifier, in which the overall amplifier dominant pole is set by elements both in the forward servo-loop amplifier paths and also in the negative feedback paths.

My trials with Bang and Olufsen ICEpower models 250A, 500A, 250ASP and 500ASP, yielded the following performance results: the distortion, at 20 kHz at higher powers but below clipping, into 4 ohms appeared to be close to 1% (100 kHz measurement bandwidth). This is roughly 2 orders of magnitude worse than typical well-designed traditional analogue amplifiers. From my general knowledge of this field, I suspect that the ICEpower units tested perform relatively well compared to other commercially available class-D amplifier products.

While I have referred to a specific class-D amplifier that Is commercially available I am aware that units do vary and as such results should of themselves not be necessarily taken as confirmation, but they do suggest that there is some difficulty with such amplifiers.

An object of this invention is therefore to provide an amplifier improvement that assists in reducing distortion or at least provides the public with a useful alternative.

DISCLOSURE OF THE INVENTION

In one form of the invention, it may be said to be embodied in an electronic class-D amplifier comprising:

an amplifier input adapted to receive an amplifier input signal, an amplifier output adapted to produce an amplifier output signal, an output switching stage, at least one servo-loop amplifier plus pulse width modulator, a controlled delay stage including a delay modulation input, an input signal processor, wherein the amplifier input is connected to an input of the servo-loop amplifier plus pulse width modulator, the amplifier input being connected to an input of the input signal processor which modifies the amplifier input signal, an output of the input signal processor being connected to the delay modulation input of the controlled delay stage, an output of the servo-loop amplifier plus pulse width modulator being connected to an input of the controlled delay stage, an output of the controlled delay stage being connected to an input of the output switching stage, and an output of the output switching stage being connected to the amplifier output, wherein a negative feedback path connects an output of the output switching stage to an input of the servo-loop amplifier.

In preference, the forward transfer function between the input of the input signal processor and delay between the input and output of the controlled delay stage includes at least a square function.

In preference, there are further included power supply rails which supply the output switching stage, wherein peaks of a carrier reference signal track a difference in potential between the said supply rails which supply the output switching stage, the carrier reference signal being generated within the servo-loop amplifier plus pulse width modulator In preference, the forward gain of the output switching stage, the forward gain of the servo-loop amplifier plus pulse width modulator and controlled delay stage, and the carrier reference output signal's mean frequency, and modulation gain of the controlled delay stage, and the gain of the negative feedback path, are selected to lower the distortion of a signal at the amplifier output relative to a signal applied to the amplifier input.

In preference, the servo-loop amplifier plus pulse width modulator includes at least one wide-band amplifier with a unity-gain-bandwidth of at least greater than 100 MHz.

In preference, the mean output carrier reference signal frequency, and the peak signal from the output of the output switching stage and potential currents flowing within this stage, are consistent with class-D power audio amplification.

BRIEF DESCRIPTION OF THE DRAWINGS

For a better understanding, further description will now be given, with reference to drawings in which.

BEST MODE FOR CARRYING OUT THE INVENTION

It is my experience that many texts in this field merely present solutions, sometimes with relatively esoteric mathematics which is often intractable. It is further my experience that some researchers purporting to be skilled in the art of class-D amplifiers do not seem to hold a useful mechanistic model in their minds of distortion production. To aid the reader to comprehend the mechanisms causing distortion in prior art class-D amplifiers, and the effects of solutions disclosed in this invention, an mechanistic model is presented in which the operations may be more easily understood intuitively.

Hence, some of the below description is merely an aid to understanding via a useful mechanistic model and should not be taken in the same sense as a rigorous scientific explanation.

I have discovered that for common prior art class-D amplifier system gains and frequencies, the class-D amplifier may be thought of approximating a non-linear non-switching analogue amplifier, containing to a first order approximation:

A servo-loop amplifier wired up in the same way as class-D servo-loops, namely as an integrator which integrates an error signal equal to the difference between the output and input signal, an output buffer stage acting as an analogue to the output switching stage of the class-D amplifier, but including a variable time period advance element between the integrating servo-loop amplifier's output and an input to the output buffer stage.

Figure 3:
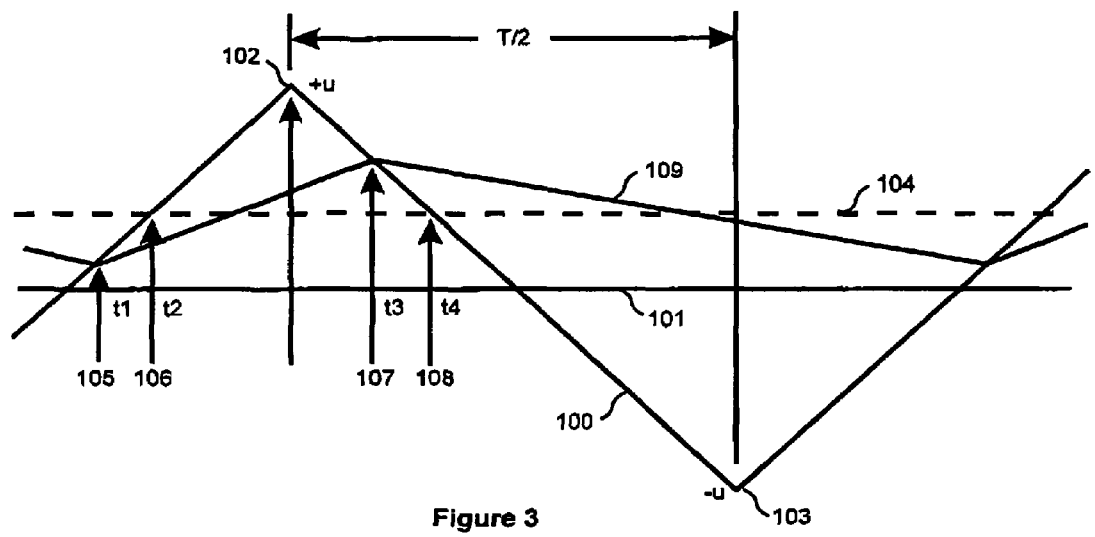
FIG. 3 shows waveforms of a triangular-wave carrier reference signal and servo-loop amplifier output for a D.C. input signal.
Figure 4:
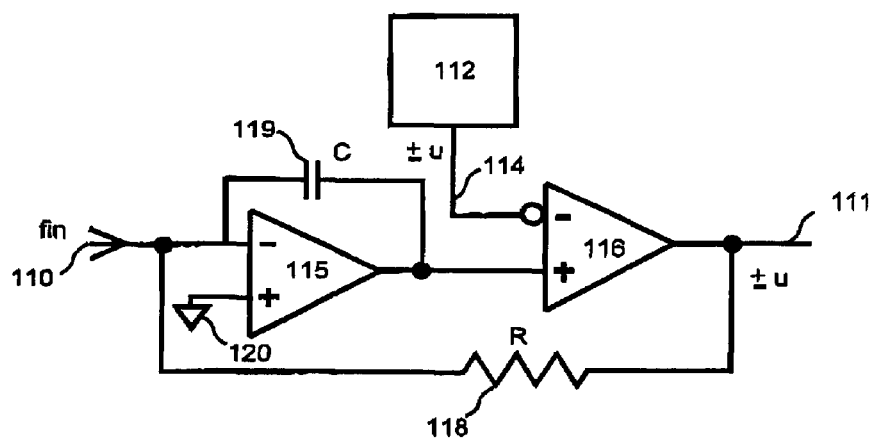
FIG. 4 shows a circuit containing the basic elements for a prior art class-D amplifier whose values and operation is described in analysis herein.

The reason for this variable time period advance element may be easiest visuailsed in FIG. 3. This shows both the output of a servo-loop amplifier, and the triangular-wave carrier reference signal for a D.C. input signal. These signals may arise from prior art class-D circuit such as that shown in FIG. 4. In order to simplify analysis, the output of this circuit 111 switches between +/−u volts and the peaks of the triangular-wave at the output of the oscillator 112 are also +/−u volts.

The triangular-wave oscillator 112 has an output 114 connected to an inverting input of a comparator plus output switching stage 116. The triangular-wave signal at 114 has a fundamental period of T. The output 111 of the comparator plus output switching stage 116 is the output of the class-D amplifier. The input 110 of the class-D amplifier in FIG. 5 is a current signal. This feeds an inverting input of the class-D amplifier, which is the inverting input of a servo-loop operational amplifier 115. Its non-inverting input is referenced to ground 120. A capacitor 119 of value C is connected between the output 117 of the servo-loop operational amplifier 115, and its inverting input. The output 117 is connected to a non-inverting input of the comparator and switching stage 116. A resistor 118 of value R is connected between the output 111 of the comparator and switching stage 116 and the inverting input of the servo-loop amplifier 115. This forms a negative feedback path from the output to the input of the class-D amplifier. In this circuit, the servo-loop amplifier is wired up as an integrator. The combination of 115 and 119 may be thought of as the servo-loop amplifier.

A D.C. input signal at 110 results in the signals shown in FIG. 3. This D.C. input signal is a D.C. current of value −i, causes a mean offset 104 of value x volts, at the output 117 of the servo-loop amplifier 115, about which the output signal 109 of the servo-loop amplifier 115 oscillates. This signal has a positive slope of $(i+u/R)/C$ volts/second when the output 111 is −u volts, and a negative slope $(i-u/R)/C$ when the output 111 is +u volts. The triangular-wave carrier reference signal 100 peaks at +u at 102 and −u at 103 and is symmetric about 0V 101. This signal appears at 114. Switching transitions at 111 occur when the servo-loop amplifier's output voltage 109 equals the triangular-wave voltage 100, namely at 105 at time t1, and 107 at time t3. The advance period results from the asymmetry of t1 and t3 relative to the peak of the triangular-wave 102. The symmetric times would be at 106, t2, and 108, t4, for the same duty cycle. If 104 is increased to the limit just below +u, at 102, then the advance period is 0 seconds.

The advance period=$t2-t1=t4-t3=T(1-(x/u)^2)/(16RC)$  (i).

This non-linear advance function is the main cause of the intrinsic distortion.

To simplify the below analysis, assume that the input signal is a sine-wave of amplitude i and frequency $f_{in}$ and is approximately in phase and proportional to the mean signal at the output of the servo-loop amplifier (this is only approximate at higher frequencies). The non-linear function (i) behaviour results in several features of this system:

The distortion relative to the output signal level is approximately proportional to $(if_{in})^2$: The $i^2$ resulting from the square in equation (i) and the $f^2$ resulting from a factor of f from the percentage of phase advance being proportional to frequency $f_{in}$, and another factor of f resulting from the feedback factor which is proportional to the open loop forward gain, decreasing as $1/f$ owing to the forward gain of the integrator.

Owing to symmetry, the idealised harmonic distortion is odd only, mostly third owing to the relatively smooth non-linear transfer function (i), and the phase of the third harmonic is at quadrature relative to the fundamental of the input signal's sine-wave measured at the output of the output switching stage. The sign of this third harmonic is consistent with the fundamental sine-wave appearing to be delayed slightly near the peaks.

The output of the servo-loop amplifier is intrinsically asymmetric relative to the peak of the fundamental, even if the fundamental frequency $f_{in}$ at the output of the servo-loop is notched out.

I have discovered a it is possible to approximately null out this distortion by adding a controlled variable delay circuit between the comparator and output switching stage. This delay is controlled to be in proportion to $(pi)^2+q$, where p and q is a constant; p being selected to cause cancellation of the non-linear advance effect; A better result is achieved when the phase and gain of pi relative to i compensate the closed loop phase and gain of the amplifier.

Figure 1:
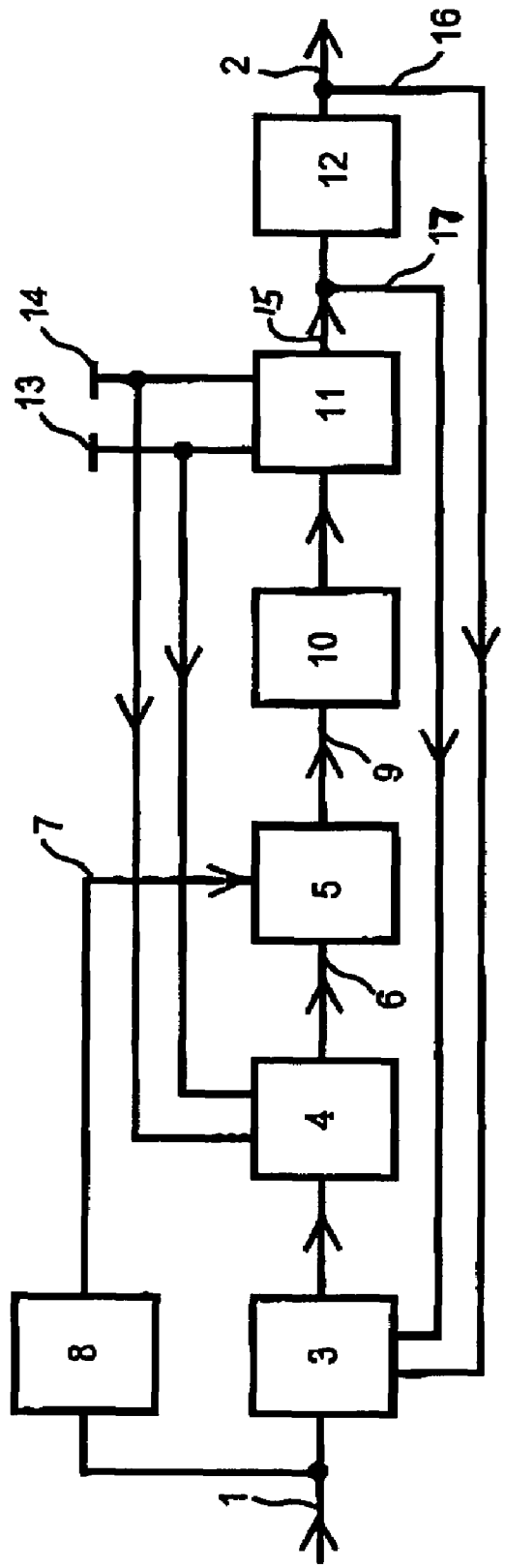
FIG. 1 is a functional block diagram of the invention.

In FIG. 1, which shows a block diagram of an example of an electronic class-D amplifier utilising this invention, an amplifier input at 1 feeds an input of a servo-loop amplifier 3 and an input of an input signal processor 8. The output of the servo-loop amplifier 3 feeds a modulation input of a pulse width modulator 4. The servo-loop amplifier 3 plus pulse width modulator 4 may be considered as a single block herein called the servo-loop amplifier plus pulse width modulator. An output of the pulse width modulator 4 is connected to an input 6 of a controlled delay stage 5. An output of the input signal processor 8 is applied to a modulation input 7 of the controlled delay stage 5. An output 9 of the controlled delay stage 5 controls drivers 10 which in turn control output switches 11. The combination of drivers 10 plus output switches 11 will herein be called an "output switching staged" wherein the input of the output switching stage is the input 9 to the drivers 10, and the output is the output 15 of the output switches 11. Output switches 11 are supplied by power supply rails 13 and 14. An output 15 of the output switching stage is fed back via a first negative feedback path 17 to an input of the servo-loop amplifier 3. In order to reduce power supply rail gain modulation of the amplifier, the forward gain of the pulse width modulator 4 is controlled to be inversely proportional to the difference in potential between power supply rails 9 and 10. The output 15 of the output switching stage 11 may be connected to a carrier frequency plus harmonic filter, sometimes called a demodulation filter 12. An output of this filter is connected the amplifier output 2. The demodulation filter 12 may also be included within the definition of the output switching stage. In a further embodiment, a further negative feedback path 16 may be connected between the amplifier output 2 and an input to the servo-loop amplifier 3.

However in practice, the potential low distortion intrinsic to a system of the present invention including the controlled delay stage is reduced by electronic imperfections which are typically most acute in output switching stages. In audio power amplifiers these output switching stages often produce transient peak currents of many tens of amperes and produce cross-over distortion resulting from switching dead-times.

One way of significantly reducing the effects of electronic imperfections is to increase the amount of negative feedback by a higher order servo-loop (that is greater than the first order of the common system). However, this feature actually intrinsically adds more distortion at higher frequencies as stated above. In order to negate this, forward transfer functions of integrating elements in both the oscillator and servo-loop amplifier are required to be at least second order. These are selected so that the carrier signal output compensates that of the servo-loop transfer function. This then makes it possible to intrinsically reduce the distortion to near zero levels using the controlled delay stage.

With the mean output carrier reference signal frequency, and the peak signal from the output of the output switching stage and potential currents flowing within this stage, consistent with class-D audio power amplification, it is possible to produce an audio power amplifier using these techniques with similar performances to common well designed class-A, -B, or -AB analogue amplifiers.

Figure 2:
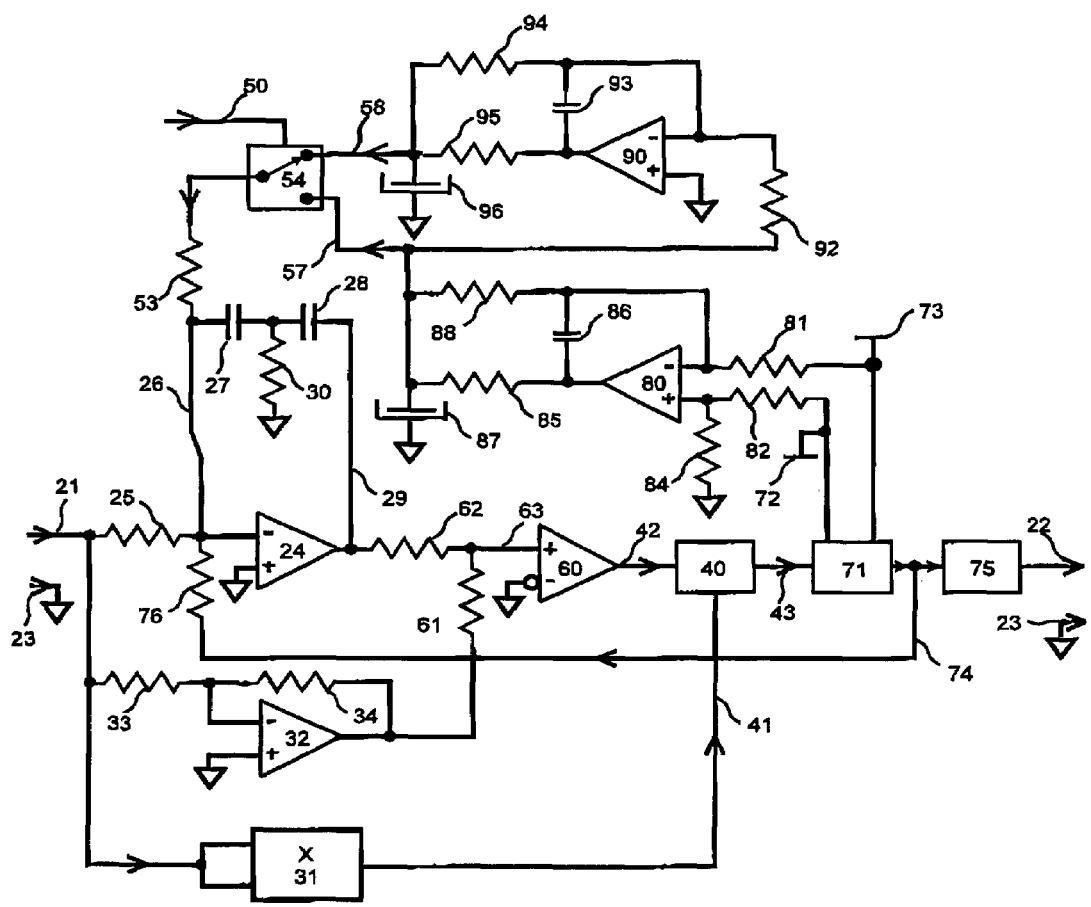
FIG. 2 is an exemplary circuit of the system of the invention.

FIG. 2 gives an example of such a system. The amplifier input signal is applied to the amplifier input 21 and an output signal is available at the amplifier output 22. The amplifier earth is at rail 23. The amplifier input 21 via resistor 25 is connected to a servo-loop amplifier consisting of resistor 30, capacitors 27 and 28, and operational amplifier 24. These same components form the servo-loop amplifier integrating element and these are configured to produce a second order forward transfer function, that is, the ratio between the signal at 21 and the signal at 29 is $$-[1+R30(C27+C28)s]/(R25\ R30\ C27\ C28\ s^2) \quad \text{(ii)}$$

where s is the Laplace variable (="–jw" for cw sine-waves).

The amplifier input 21 is also connected to an input signal processor 31, in this example a multiplier connected as a squarer.

Further, the amplifier input 21 is also connected to an inverting amplifier consisting of resistors 33 and 34, and operational amplifier 32.

The output 29 of the servo-loop amplifier is fed to a non-inverting input of comparator 60 via resistor 62. The output of the inverting amplifier (32, 33, 34) also is fed to the non-inverting input of comparator 60 via resistor 61.

The output 42 of comparator 60 is fed to an input of a controlled delay stage 40. An output 43 of the controlled delay stage controls drivers plus output switches 71, or in other words an output switching stage. 71 is supplied by power supply rails 72 and 73. An output 74 of the output switching stage 71, is fed back to an input of the servo-loop amplifier as a negative feedback path via resistor 76. The output 74 of the output switching stage 71 is also fed to a filter which attenuates the carrier frequency plus harmonics which is sometimes called a demodulation lifter 75. An output of this filter is the amplifier's output 22. The switch drivers plus output switches 71 may be said to form an output switching stage, and the demodulation filter 75 may be considered as included within the definition of the output switching stage.

The output of the input signal processor 31, is fed to the modulation input 41 of the controlled delay stage 40.

A carrier reference square-wave signal controls at a control input 50, an analogue switch 54 which switches between the voltages at 58 and 57. The difference in potential between the power supply rails 72 and 73 is measured by a difference amplifier consisting of operational amplifier 80, resistors 81, 82, 84, 85, and 88, and capacitors 86 and 87. The output 57 of this difference amplifier is low impedance at all frequencies owing to the action of the capacitors and local negative feedback. Capacitor 86 is necessary to form a local dominant pole for stability purposes. The signal at 57 is inverted by an inverting amplifier consisting of resistors 92, 94 and 95, and capacitors 93 and 96, and operational amplifier 90. The output 58 of this inverter is also low impedance at all frequencies. Thus 57 and 58 track the mean difference in power supply rail voltage between 72 and 73 which in turn causes the output of the switch 54 to produce a square-wave at the carrier reference frequency at peak voltages which track a difference in potential between power supply rails which supply the output switching stage.

This square-wave produces a quasi-triangular-wave component at the output 29 of the servo-loop amplifier which is the carrier reference signal. This quasi-triangular-wave component would be an actual triangular-wave if the value of resistor 30 is infinity, which results in the forward transfer function of the servo-loop amplifier being first order and in fact an integrator. A finite value of resistor 30 creates a second-order transfer function which causes the slopes of the triangular wave to be "bent" according to an exponential function. This second order function is thus intrinsic to the amplifier dominant pole (set by servo-loop amplifier forward transfer function) and quasi triangular-wave carrier reference signal. This circuit utilises the square-wave carrier input system described above.

The gain of the output switching stage 71 is proportional to the power supply rail difference voltage between 72 and 73. The action of producing a square-wave at the output of switch 54 which is also proportional to the difference in voltage between 72 and 73, has the effect of producing a forward transfer gain of the pulse width modulator which is inversely proportional to the difference in voltage between 72 and 73. The net effect is to produce an "open-loop" gain which is independent of power supply variation and modulation.

The D.C. closed loop gain of the amplifier is the negative value of resistor 76 divided by the value of resistor 25, assuming that the D.C. gain of the demodulation filter 25 is exactly one; that is:

$$\text{Amplifier gain } G = -R76/R25 \quad \text{(ii)}$$

If the forward mean D.C. gain between output 29 and output 22 is m with the output of amplifier 32 constrained to be zero volts (at earth 23 potential), and the D.C. gain of the inverting amplifier (32, 33, 34) is $$n = -R34/R33 \quad \text{(iii)},$$

$$\text{then if } n = G/m \quad \text{(iv)},$$

The mean output of the servo-loop amplifier at 29 will be zero for all (non-overloading) D.C. input signals and dose to zero for frequencies within the amplifier bandwidth. This thus has the effect of approximately producing and amplifier with a flat frequency and phase response within the bandwidth of the amplifier between the input 21 and output 74. If the inverting amplifier (32, 33, 34) is omitted, then a phase and gain compensation network needs to be incorporated into the input signal processor 31 to compensate the closed loop gain-phase transfer function of the amplifier between input 21 and output 42 of comparator 60, for optimal distortion cancellation.

It should be noted that there are many different ways to implement the above equations, and hence FIG. 2 is merely an example of one such way. Another, for example, is the triangular-wave carrier input system. Furthermore, a triangular wave is merely an example of a carrier reference signal, another for example is the carrier reference signal described above using a second order loop integrating element.

Owing to the relatively high frequency of typical carrier reference signals (>=500 kHz), which no doubt will increase as electronic components improve in future years, it is beneficial for accuracy of the carrier signal and servo-loop amplifier and hence whole amplifier to utilise a wideband operational amplifier within the integrating elements owing to the relatively high gains of such devices at the carrier reference signal frequency and its harmonics. For example, a wideband amplifier with a unity-gain-bandwidth of more than 100 MHz is useful.

Throughout this specification the purpose of the description has been to illustrate the invention and not to limit this.

What is claimed is:

1. An electronic class-D amplifier comprising:
   an amplifier input adapted to receive an amplifier input signal,
   an amplifier output adapted to produce an amplifier output signal,
   an output switching stage,
   at least one servo-loop amplifier plus pulse width modulator,
   a controlled delay stage including a delay modulation input, an input signal processor, wherein the amplifier input is connected to an input of the servo-loop amplifier plus pulse width modulator, the amplifier input being connected to an input of the input signal processor which modifies the amplifier input signal, an output of the input signal processor being connected to the delay modulation input of the controlled delay stage, an output of the servo-loop amplifier plus pulse width modulator being connected to an input of the controlled delay stage, an output of the controlled delay stage being connected to an input of the output switching stage, and an output of the output switching stage being connected to the amplifier output, wherein a negative feedback path connects an output of the output switching stage to an input of the servo-loop amplifier.

2. An electronic class-D amplifier as in claim 1, wherein the forward transfer function between the input of the input signal processor and delay between the input and output of the controlled delay stage includes at least a square function.

3. An electronic class-D amplifier as in claim 1, further including power supply rails which supply the output switching stage, wherein peaks of a carrier reference signal track a difference in potential between the said supply rails which supply the output switching stage, the carrier reference signal being generated within the servo-loop amplifier plus pulse width modulator.

4. An electronic class-D amplifier as in claim 1 wherein the forward gain of the output switching stage, the forward gain of the servo-loop amplifier plus pulse width modulator and controlled delay stage, and the carrier reference output signal's mean frequency, and modulation gain of the controlled delay stage, and the gain of the negative feedback path, are selected to lower the distortion of a signal at the amplifier output relative to a signal applied to the amplifier input.

5. An electronic class-D amplifier as in claim 1 wherein the servo-loop amplifier plus pulse width modulator includes and at least one wide-band amplifier with a unity-gain-bandwidth of at least greater than 100 MHz.

6. An electronic class-D amplifier as in claim 1 wherein the mean output carrier reference signal frequency, and the peak signal from the output of the output switching stage and potential currents flowing within this stage, are consistent with class-D power audio amplification.

* * * * *